United States Patent
Tanizaki et al.

(10) Patent No.: US 6,782,498 B2
(45) Date of Patent: Aug. 24, 2004

(54) SEMICONDUCTOR MEMORY DEVICE ALLOWING MOUNTING OF BUILT-IN SELF TEST CIRCUIT WITHOUT ADDITION OF INTERFACE SPECIFICATION

(75) Inventors: Tetsushi Tanizaki, Hyogo (JP); Takeshi Hamamoto, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 483 days.

(21) Appl. No.: 09/758,042

(22) Filed: Jan. 11, 2001

(65) Prior Publication Data

US 2001/0054164 A1 Dec. 20, 2001

(30) Foreign Application Priority Data

Jan. 13, 2000 (JP) ........................................ 2000-004881

(51) Int. Cl.[7] ............................. G11C 29/00; G11C 7/00
(52) U.S. Cl. ......................... 714/733; 714/718; 365/201
(58) Field of Search ................................ 714/718, 733; 365/200, 201

(56) References Cited

U.S. PATENT DOCUMENTS

| | | | | |
|---|---|---|---|---|
| 4,942,556 A | * | 7/1990 | Sasaki et al. | 365/200 |
| 5,222,066 A | * | 6/1993 | Grula et al. | 714/718 |
| 5,506,959 A | * | 4/1996 | Cockburn | 714/42 |
| 5,675,545 A | * | 10/1997 | Madhavan et al. | 365/201 |
| 5,844,914 A | * | 12/1998 | Kim et al. | 714/718 |
| 5,987,632 A | * | 11/1999 | Irrinki et al. | 714/711 |
| 6,088,823 A | * | 7/2000 | Ayres et al. | 714/733 |
| 6,115,763 A | * | 9/2000 | Douskey et al. | 710/72 |
| 6,304,989 B1 | * | 10/2001 | Kraus et al. | 714/733 |
| 6,496,947 B1 | * | 12/2002 | Schwarz | 714/30 |

FOREIGN PATENT DOCUMENTS

| | | |
|---|---|---|
| JP | 57-55598 | 4/1982 |
| JP | 59-168995 | 9/1984 |
| JP | 60-65360 | 4/1985 |
| JP | 61-67162 | 4/1986 |
| JP | 10-134599 | 5/1998 |

* cited by examiner

Primary Examiner—Joseph D. Torres
(74) Attorney, Agent, or Firm—McDermott Will & Emery LLP

(57) ABSTRACT

In the semiconductor memory device, a control circuit generates various commands for a memory cell array according to an internal command control signal and an internal address signal output from an input switching circuit for switching an input source of the command control signals and the address signal between an external terminal and a BIST circuit. In the BIST mode, the input switching circuit cuts the signal input from the external terminal and generates the internal command control signal and the internal address signal according to an output signal from the BIST circuit. Transition to the BIST mode and return to the normal operation mode are indicated by a combination of signals supplied to the external terminal. Therefore, an interface between a built in BIST circuit and other internal circuits can be secured without an addition of a special interface specification.

16 Claims, 8 Drawing Sheets

NUMBER OF STAGES n IS SET INDEPENDENTLY

NUMBER OF STAGES m IS SET INDEPENDENTLY

SEMICONDUCTOR MEMORY DEVICE ALLOWING MOUNTING OF BUILT-IN SELF TEST CIRCUIT WITHOUT ADDITION OF INTERFACE SPECIFICATION

BACKGROUND OF THE INVENTION

1. Field of the Invention

The present invention relates to semiconductor memory devices, and more particularly to semiconductor memory devices with built-in BIST Built In Self Test) circuits.

2. Description of the Background Art

A structure of semiconductor memory devices with built-in BIST circuits is known as a structure incorporating a tester function into a chip and allowing a test of the chip without the use of an expensive LSI tester.

The BIST circuit in the semiconductor memory device supplies as outputs a command and test data to a circuit to be tested according to a test pattern held in advance for performing a self test in response to an activation request. In addition, the BIST circuit generates an expected value of a response of the circuit to be tested to the test pattern, determines whether an output from the circuit to be tested matches with the expected value and outputs the result of the determination.

Here, in memory devices such as semiconductor memory devices or the like, an interface between the device and external devices must be considered. Particularly for general-purpose products, a common interface specification is usually determined.

The BIST circuit has a various advantages such as elimination of an expensive test device for the test of the device, reduction of the number of test signals supplied from an external source and ability of performing a so-called AT-SPEED test. When the BIST circuit is to be mounted particularly on a general-purpose memory device, however, a problem arises with regard to how to secure an interface between the BIST circuit and an internal circuit of the memory device in compliance with the commonly determined interface specification.

Japanese Patent Laying-Open No. 60-65360, for example, discloses a structure including a memory diagnostic control circuit inside which is functionally equivalent to the BIST circuit, however a description in detail is not provided as to how an interface between the BIST circuit and the internal circuit of the device is actually secured.

In addition, FIG. 4 of Japanese Patent Laying-Open No. 10-134599 discloses, with regard to memory devices with BIST circuits, a structure in which a test input signal generated by a self-diagnostic circuit which is functionally equivalent to the BIST circuit and an input signal at a normal time are selectively supplied as an input to a semiconductor memory according to a test switching signal supplied as an input to a dedicated test switching pin. However, as the structure like this requires a dedicated input pin, it cannot be adopted under the general-purpose interface specification.

SUMMARY OF THE INVENTION

An object of the present invention is to provide a structure of a semiconductor memory device allowing securing of an interface between a built-in BIST circuit and an internal circuit without an addition of a special interface specification.

In summary, the present invention is a semiconductor memory device operating in response to a plurality of command control signals and an address signal including a plurality of address bits, and includes a memory cell array, a plurality of external command terminals, a plurality of external address terminals, a self test circuit, a first input switching circuit, a second input switching circuit, a test mode circuit and a control circuit.

The memory cell array includes a plurality of memory cells arranged as a matrix. The plurality of external command terminals externally receives the plurality of command control signals. The plurality of external address terminals externally receives the plurality of address bits. The self test circuit operates at a time of test execution and supplies the plurality of command control signals and the plurality of address bits based on a predetermined test pattern. The first input switching circuit supplies a plurality of internal command control signals according to the plurality of command control signals received from the plurality of external command terminals or the plurality of command control signals received from the self test circuit. The second input switching circuit supplies an internal address signal having a plurality of address bits according to the plurality of address bits received from the plurality of external address terminals or the plurality of address bits received from the self test circuit. The test mode circuit determines an operation state of the self test circuit according to the plurality of internal command control signals and the internal address signal. The control circuit controls outputs of first and second input switching circuits according to the operation state of the self test circuit. The control circuit generates a command for the memory cell array according to the plurality of internal command control signals and the internal address signal.

Hence, a main advantage of the present invention lies in that a source of an input of the command control signal and the address signal to the control circuit can be switched according to the state of operation of the self test circuit between the external command terminal and the external address terminal and the self test circuit, whereby the semiconductor memory device can be operated in response to the output signal from the self test circuit during the test mode without the special interface for the external source.

The foregoing and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
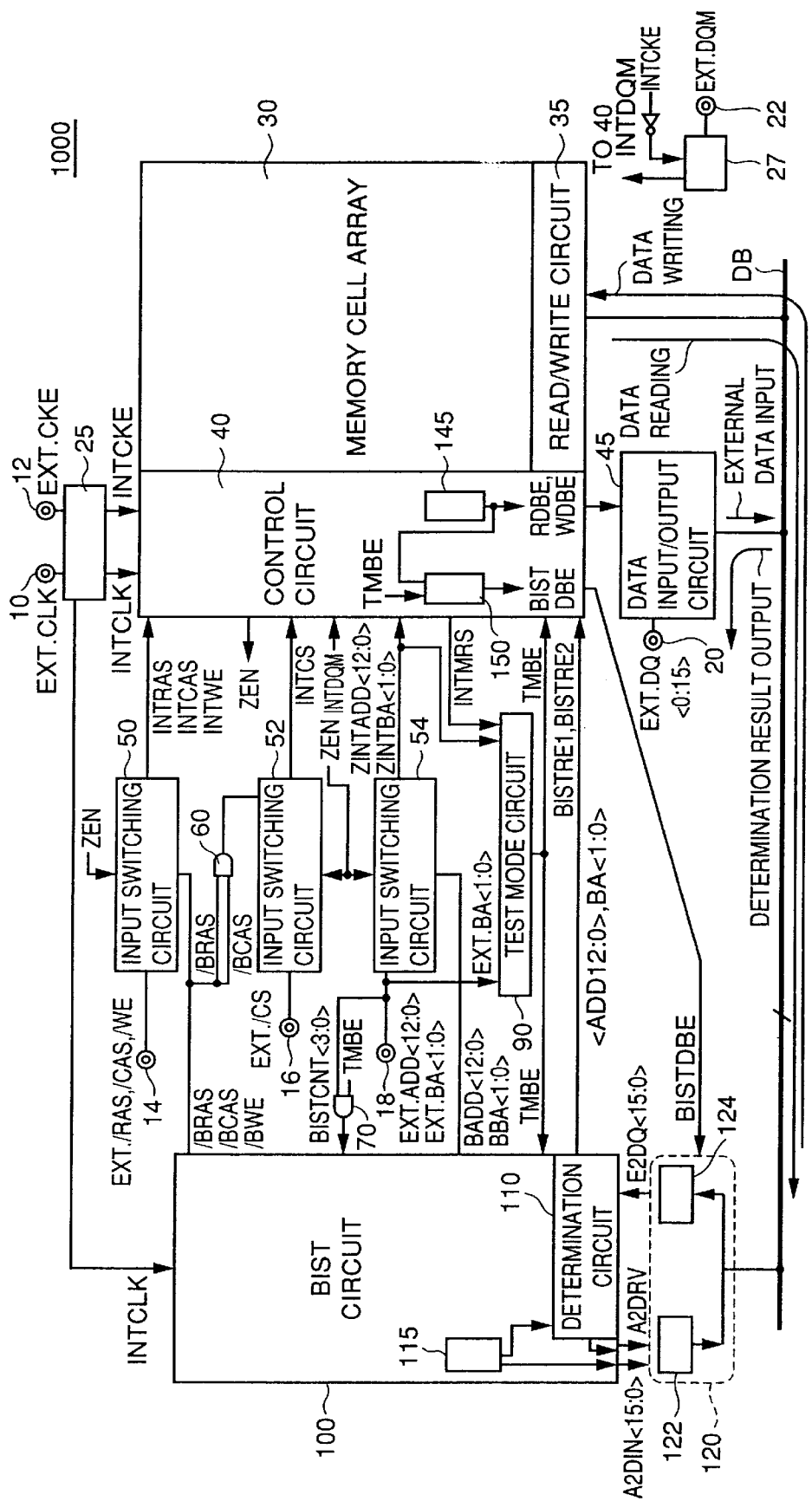
FIG. 1 is a block diagram showing a structure of a semiconductor memory device 1000 according to the embodiment of the present invention.

The preferred embodiment of the present invention will be described in detail below with reference to the drawings. In the drawings, the same reference character denotes the same or a corresponding portion.

Interface for Command Control Signal and Address Signal

With reference to FIG. 1, a semiconductor memory device 1000 includes a clock terminal 10 receiving an external clock signal EXT.CLK, a clock enable terminal 12 receiving an external clock enable signal EXT.CKE, a clock buffer 25 receiving an external clock signal EXT.CLK and an external clock enable signal EXT.CKE from clock terminal 10 and clock enable terminal 12, respectively, and supplying an internal clock signal INTCLK and an internal clock enable signal INTCKE as outputs, a command control signal input terminal 14 externally receiving command control signals such as an external row address strobe signal EXT./RAS, an external column address strobe signal EXT./CAS and an external write enable signal EXT./WE and a chip select terminal 16 externally receiving an external chip select signal EXT./CS. Hereinbelow the command control signals externally supplied will also collectively be referred to as an external command control signal.

Further, semiconductor memory device 1000 includes an address input terminal 18 receiving an external address bits EXT.ADD<12:0> and external bank address bits EXT.BA<1:0>, and a data input/output terminal 20 inputting/outputting an input/output data signal EXT.DQ<0:15>.

Thus, semiconductor memory device 1000 complies with the general-purpose interface specification.

Here, the numbers of bits of the external address signal and input/output data signal described above are mere examples and the numbers of bits can be set to any numbers. In addition, though command control signal input terminal 14 and address input terminal 18 receive a plurality of signals (bits), in drawings each of them is shown collectively as a single terminal.

Semiconductor memory device 1000 further includes a data mask terminal 22 for indicating a temporal suspension of data input/output and an input buffer 27 corresponding to data mask terminal 22. Input buffer 27 generates a data mask control signal INTDQM in response to a data mask external control signal EXT.DQM supplied to data mask terminal 22. A control circuit 40 generates a data mask command in response to an activation of data mask control signal INTDQM and suspends data input/output between a read/write circuit 35 and a data bus DB temporarily.

Semiconductor memory device 1000 further includes a BIST circuit 100. BIST circuit 100 is turned to an operational state by a self test enable signal TMBE and performs a self test. Hereinbelow, a state in which the self test is being performed by BIST circuit 100 will be referred to as a self test mode or a BIST mode. On the other hand, a state in which the BIST circuit is not operative and the semiconductor memory device operates according to an external input will be referred to as a normal operation mode.

In the BIST mode, BIST circuit 100 supplies as command control signals and address signals corresponding to a previously prepared test pattern, according to self test control bits BISTCNT<3:0> supplied from a logical circuit 70, a test row address strobe signal/BRAS, a test column address strobe signal/BCAS and a test write enable signal/BWE, test address bits BADD<12:0> and test bank address bits BBA<1:0>, each of them is a test signal corresponding respectively to externally input command control signals. Hereinbelow, these command control signals generated by BIST circuit 100 will also be denoted collectively as a test command control signal.

BIST circuit 100 includes a test data generation circuit 115. Test data generation circuit 115 outputs a test data signal to be supplied as an input to a test object to perform a predetermined self test and generates an expected value at the time of reading (data output) of the test object.

The self test for memory cell array 30 is performed by BIST circuit 100 using these command control signals, the address signals and the test data signals.

BIST circuit 100 further includes a determination circuit 110. Determination circuit 110 receives output data from the test object having received an input according to the test pattern, determines whether the output data matches with an expected value and outputs the result of determination.

Semiconductor memory device 1000 further includes memory cell array 30 having a plurality of memory cells arranged as a matrix, control circuit 40 for controlling read/write operations for memory cell array 30, and read/write circuit 35 for performing data reading and data writing of memory cell array 30 under the control of control circuit 40. Memory cell array 30, control circuit 40 and read/write circuit 35 are the test objects of BIST circuit 100.

Semiconductor memory device 1000 further includes input switching circuits 50, 52 and 54.

Control circuit 40 is responsive to internal command control signals INTRAS, INTCAS and INTWE, an internal chip select signal INTCS, internal address bits ZINTADD<12:0> and internal bank address bits ZINTBA<1:0>, supplied from input switching circuits 50, 52 and 54, executes a predetermined command such as data reading/data writing operations and so on corresponding to a combination of the internal command control signals, for a memory cell selected by the internal address bits and the internal bank address bits.

Input switching circuit 50 receives command control signals EXT./RAS, EXT./CAS and EXT./WE from command control signal input terminal 14 and command control signals/BRAS,/BCAS and/BWE from BIST circuit 100, and generates internal command control signals INTRAS, INTCAS and INTWE. Internal command control signals INTRAS, INTCAS and INTWE are a row address strobe signal, a column address strobe signal and a write enable signal, respectively, supplied to control circuit 40 for the execution of the predetermined command for memory cell array 30.

In the normal operation mode, input switching circuit 50 sets the signal levels of these internal command control signals according to the signal levels of the externally supplied command control signals according to an input switching signal ZEN. On the other hand, in the BIST mode, input switching circuit 50 sets the signal levels of these internal command control signals according to the signal levels of the command control signals supplied from the BIST circuit.

Figure 2:
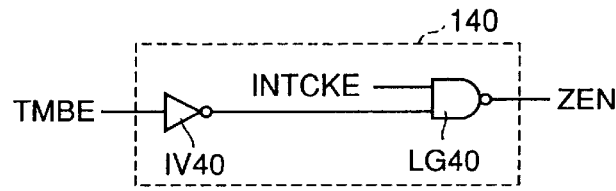
FIG. 2 is a circuit diagram showing a structure of an input switching signal generation circuit 140.

With reference to FIG. 2, an input switching signal generation circuit 140 includes an inverter IV40 inverting self test enable signal TMBE and supplying the resulting signal as an output, and a logical gate LG40 supplying the result of an NAND logical operation of internal clock enable signal INTCKE and the output signal of an inverter IV40 as input switching signal ZEN. Input switching signal generation circuit 140 is included in control circuit 40.

With this structure, in the normal operation mode in which internal clock enable signal INTCKE is in an enable state (H: logical high level) and self test enable signal TMBE is inactive (L: logical low level), input switching signal ZEN is activated (to an L level) to deliver an external input from each terminal to the memory cell array.

On the other hand, when internal clock enable signal INTCKE is set to a disable state (L level) or self test enable signal TMBE is activated (to an H level), indicating the self test, input switching signal ZEN is inactivated (to an H level) and the external input is cut and an input from BIST circuit 100 is delivered to control circuit 40.

Figure 3:
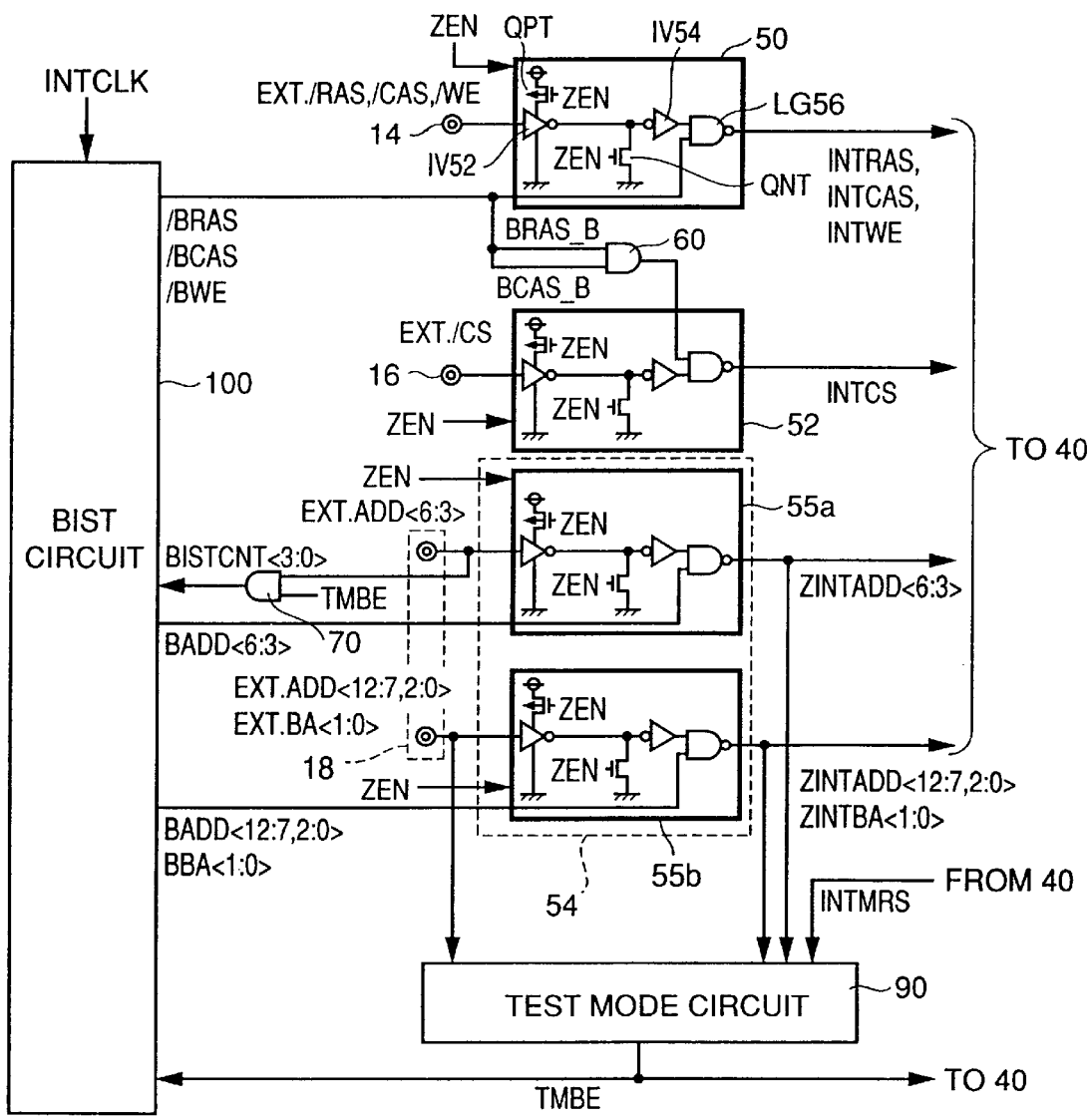
FIG. 3 is a circuit diagram referenced for describing structures of input switching circuits 50, 52 and 54 in detail.

In FIG. 3, the structures of input switching circuits 50, 52 and 54 are shown in detail.

With reference to FIG. 3, input switching circuit 50 includes an inverter IV52 for inverting the signal level on command control signal input terminal 14 and supplying the resulting signal as an output, an inverter IV54 for further inverting an output of inverter IV52 and a logical gate LG56 for supplying the result of an NAND logical operation between an output of inverter IV54 and a test command control signal corresponding to an input of inverter IV52 as an output.

Input switching circuit 50 includes a P type transistor QPT for supplying a driving current to inverter IV52 and an N type transistor QNT connected between an input node of inverter IV54 and a ground node. To the gates of transistors QPT and QNT, input switching signal ZEN is supplied.

When input switching signal ZEN attains an inactive state (H level), transistor QPT is turned off and current is not supplied to inverter IV52. In addition, a transistor QNT is turned on and the potential level of the input node of inverter IV54 is held at the ground potential regardless of an input to command control signal input terminal 14. Thus the input from an external source is cut and the internal command control signal which is an output from logical circuit LG56 is determined according to the signal level of the test command control signal.

On the other hand, when input switching signal ZEN is activated (to an L level), transistor QPT is turned on and the driving current is supplied to inverter IV52. In addition, as transistor QNT is turned off, the input node of inverter IV54 is disconnected from the ground node. Thus, as BIST circuit 100 maintains the signal level of the test command control signal to an H level in the non-operational state, logical gate LG56 sets the signal level of the internal command control signal according to the external command control signals input to command control signal input terminal 14.

Though the circuit structure of input switching circuit 50 as shown in FIG. 3 is provided corresponding to each of the row address strobe signal, the column address strobe signal and the write enable signal, for the simplicity, a single circuit is shown collectively in the drawing.

When internal clock enable signal INTCKE is in a disable state (L level), input switching signal ZEN is turned to the inactive state (H level) and the output level of inverter IV54 is fixed. Therefore, it is possible to accommodate to a so-called power down mode which is commonly adopted in the semiconductor memory device by forming a structure in which a through current of a first stage of an input circuit is cut in response to the disable state of the clock enable signal.

As far as the structure allows the switching of the signal level of the internal command control signal between the externally input command control signal and the command control signal supplied from BIST circuit according to input switching signal ZEN, any circuit structure other than the structure shown in FIG. 3 can be adopted.

Input switching circuit 52 receives external chip select signal EXT./CS supplied to chip select terminal 16 and an output signal of logical circuit 60 having a signal level corresponding to test command control signals/BRAS and/ BCAS from BIST circuit 100, and supplies internal chip select signal INTCS.

In the normal operation mode, input switching circuit 52 sets the signal level of internal chip select signal INTCS according to the signal level of external chip select signal EXT./CS.

On the other hand, in the BIST mode, input switching circuit 52 sets the signal level of internal chip select signal INTCS according to a signal level of an output of a logical circuit 60. Here, in the BIST mode, if some test operation is executed by BIST circuit 100, at least one of test row address strobe signal/BRAS and test column address strobe signal/ BCAS is activated (to an L level), whereby a signal corresponding to external chip select signal EXT./CS can be generated.

Thus, by forming a structure in which a part of the test command control signals supplied from the BIST circuit is employed to generate other test command control signals near the corresponding input switching circuit through a combination of logical operations, the need of independent generation of a chip select signal in the BIST mode by the BIST circuit is eliminated, and in addition, an interconnection to deliver this signal from BIST circuit 100 to input switching circuit 52 becomes unnecessary, whereby the number of the signal lines is reduced and the layout saving is allowed.

As the structure and the operation of input switching circuit 52 are same with those of input switching circuit 50, the description thereof will not be repeated.

Input switching circuit 54, arranged corresponding to the address signal as shown in FIG. 1, includes an input switching circuit 55*a* provided corresponding to address bits EXT.ADD<6:3> among address bits and test address bits BADD<6:3> and an input switching circuit 55*b* provided corresponding to other address bits and test address bits.

Input switching circuit 55*a* supplies internal address bits ZINTADD<6:3> whereas input switching circuit 55*b* supplies internal address bits ZINTADD<12:7> and ZIN-TADD<2:0> and internal bank address bits ZINTBA<1:0>.

Input switching circuits 55*a* and 55*b* are described separately because in the BIST mode, self test control bits BISTCNT<3:0> described above is set according to external address bits EXT.ADD<6:3>.

Input switching circuits 55*a* and 55*b* have the same structure as input switching circuit 50, and generate, according to the signal level of input switching signal ZEN, internal address bits and internal bank address bits according to the signal levels of the address bits supplied to the external address terminal or the address bits supplied from BIST circuit 100. As the circuit structures of input switching circuits 55a and 55b are same with that of input switching circuit 50, the description thereof will not be repeated.

Again with reference to FIG. 1, semiconductor memory device 1000 includes a test mode circuit 90 for supplying as an output a test mode signal according to the signal level of each of address bits and a mode register set signal INTMRS supplied from control circuit 40. Control circuit 40 activates mode register set signal INTMRS when, for example, all of the internal command control signals INTRAS, INTCAS and INTWE and internal chip select signal INTCS are at an L level.

Figure 4:
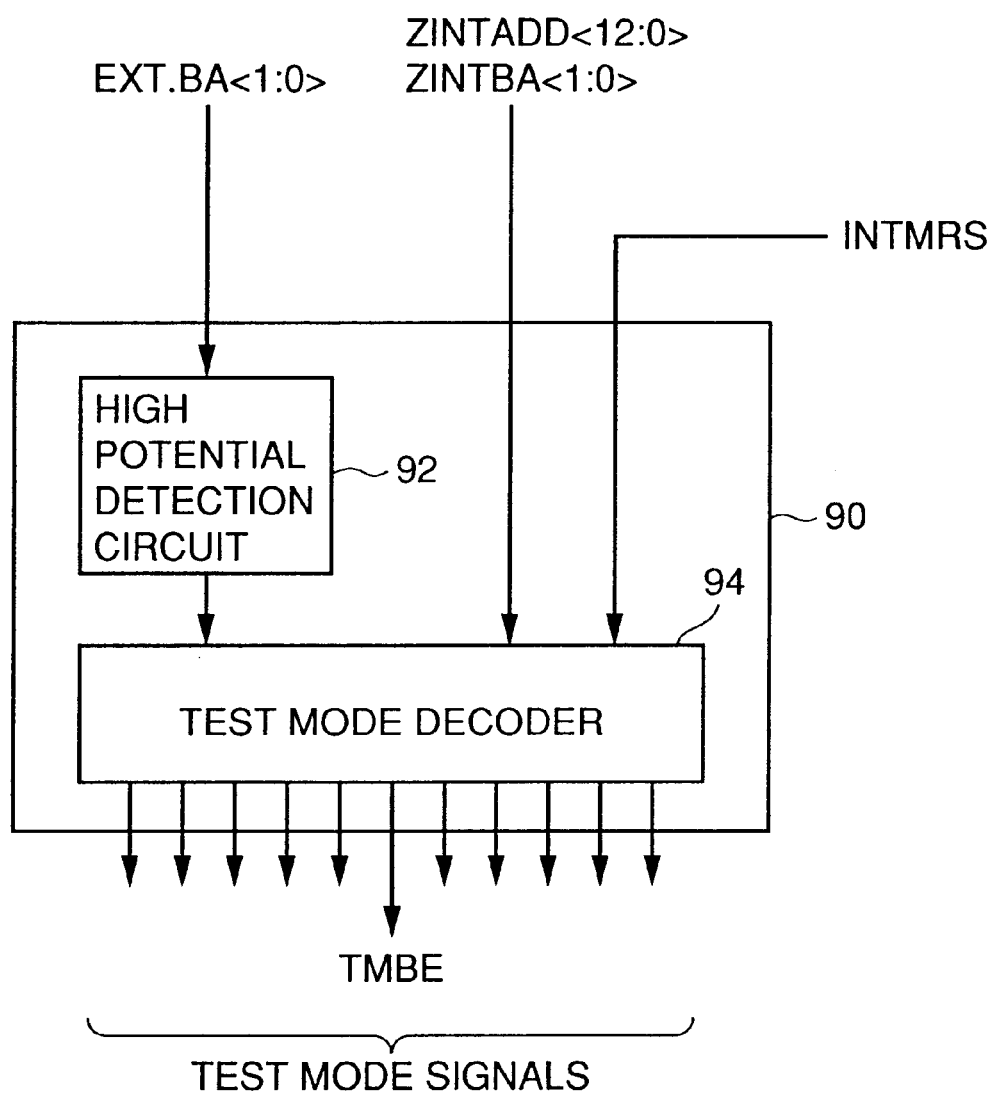
FIG. 4 is a block diagram showing a structure of a test mode circuit 90.

With reference to FIG. 4, test mode circuit 90 includes a high potential detection circuit 92 detecting an application of high potential to external bank address bits EXT.BA<1:0>. Here, external bank address bits EXT.BA<1:0> are shown as examples of an object of the application of the high potential. By using the application of the high potential to an external terminal used in the normal operation mode as a trigger to change the operation mode, the transition to the BIST mode can be externally indicated without addition of a new dedicated terminal.

Test mode circuit 90 further includes a test mode decoder 94 generating a various test mode signals. Test mode decoder 94 detects the application of the high potential to predetermined address bits by high potential detection circuit 92, and if mode register set signal INTMRS is activated by a combination of the externally supplied command control signals, activates a corresponding test mode signal according to the combination of the signal level of the each of internal address bits ZINTADD <12:0> and internal bank address bits ZINTBA<1:0>. The self test enable signal TMBE already described is one of the test mode signals and activation/inactivation thereof is controlled according to a combination of the signal levels of the internal address bits and the bank address bits.

With such structure, at the time of transition from the normal operation mode to the BIST mode, test mode circuit 90 is allowed to activate self test enable signal TMBE based on the signal levels of the externally supplied external command control signals and the external bank address bits and the internal address bits generated based on the external address bits, and to start the self test by the BIST circuit.

On the other hand, at the return to the normal operation mode after the completion of the self test, a combination of test address bits for inactivating self test enable signal TMBE may be supplied from BIST circuit 100 according to the signal level of self test control bits BISTCNT<3:0> generated based on EXT.ADD<6:3> which is a part of externally input external address bits.

In addition, a structure can be formed such that the self test is automatically ended through the output of a combination of test address bits automatically inactivating the TMBE according to a combination of self test control bits BISTCNT<3:0> at the completion of a certain test pattern.

As described above, as the activation/inactivation of input switching signal ZEN can be switched according to the change in the signal level of self test enable signal TMBE, when the source of signal input to control circuit 40 and memory cell array 30 is switched from each external terminal to BIST circuit, a direct input to control circuit 40 and memory cell array 30 from each external terminal is completely cut off.

When, however, a combination of the test address bits for ending the self test based on a part of the address bits supplied from the external terminal is supplied from BIST circuit 100 and self test enable signal TMBE is inactivated, accordingly, input switching signal ZEN is activated (to L level), and the input to control circuit 40 and memory cell array 30 again is switched to the input from each external terminal.

Hence, in semiconductor memory device 1000 according to the embodiment of the present invention the self test can be performed by the BIST circuit built in the semiconductor memory device without the interface dedicated to the self test between the device and an external device.

Interface for Data Signal

Again with reference to FIG. 1, semiconductor memory device 1000 includes data bus DB for delivering data input/output to/from memory cell array 30 and a data input/output circuit 45 for externally transmitting data on data bus DB via data input/output terminal 20.

Control circuit 40 includes a data input/output pulse generation circuit 145 generating a data input pulse WDBE and a data output pulse RDBE for each indicating data input and data output to read/write circuit 35 at the time of indication of write command and read command according to the combination of the internal command control signals.

Figure 5:
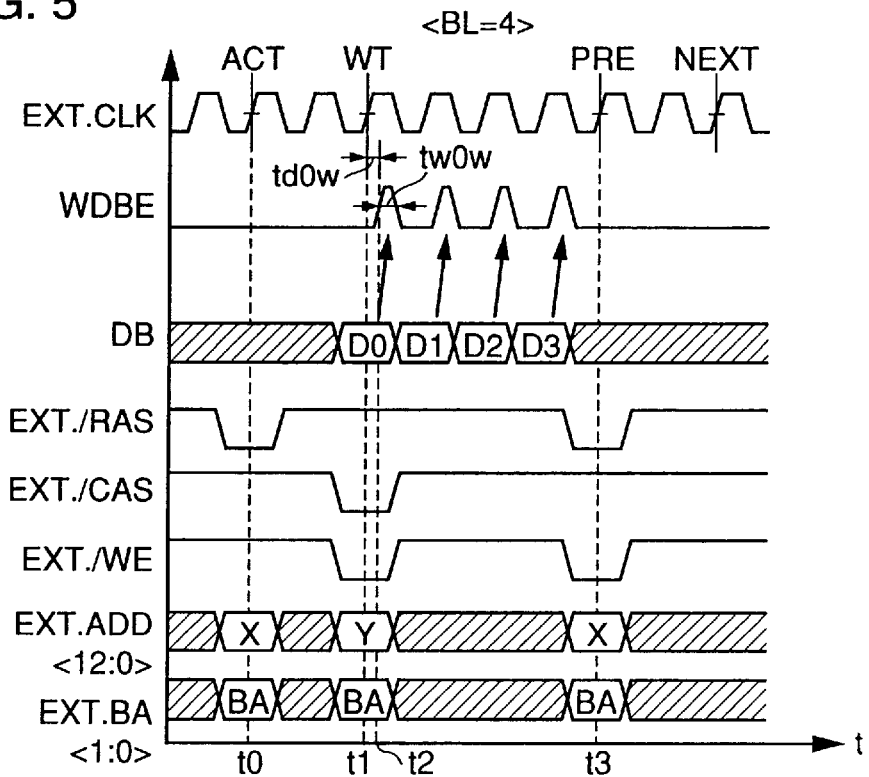
FIG. 5 is a timing chart referenced for describing a data input to a memory cell array 30 in response to a data input pulse WDBE.

In FIG. 5, a data input to memory array 30 during the normal operation mode in response to data input pulse WDBE is shown. Here, in semiconductor memory device 1000, it is assumed that CAS latency CL=3 and burst length BL=4 as an example.

With reference to FIG. 5, at time t0, by a combination of the external command control signals (EXT./RAS=L level, EXT./CAS=EXT./W=H level), an activate command ACT is indicated and a bank address BA selected according to external bank address bits EXT.BA<1:0> and a row address X selected according to external address bits EXT.ADD<12:0> are taken in.

In response thereto, a row-related operation is activated for a group of memory cells corresponding to bank address BA and row address X in memory cell array 30 by control circuit 40.

At time t1, that is, two clock cycles after the generation of activate command ACT, according to a combination of the external command control signals (EXT./RAS=H level, EXT./CAS=EXT./WE=L level), a write command WT is generated and a writing operation to a column address Y indicated by external address bits EXT.ADD<12:0> is indicated.

Data input/output pulse generation circuit 145 activates a data input pulse WDBE for a predetermined time period tw0w at time t2, that is, a predetermined time period td0w after time t1 of write command WT indication. In semiconductor memory device 1000, as burst length BL=4, activation/inactivation of data input pulse WDBE repeats at the same cycle with external clock signal EXT.CLK for four clock cycles.

Read/write circuit 35 supplies data D0~D3 corresponding to the burst length delivered on data bus DB sequentially during each activation period of data input pulse WDBE.

At time t3 when the clock cycle corresponding to the burst length has elapsed and the data input has completed, a precharge command PRE is activated for the same bank address BA according to a combination of the external command control signals (EXT./CAS=H level, EXT./RAS=EXT./WE=L level) and a preparation for the next command input is performed.

Figure 6:
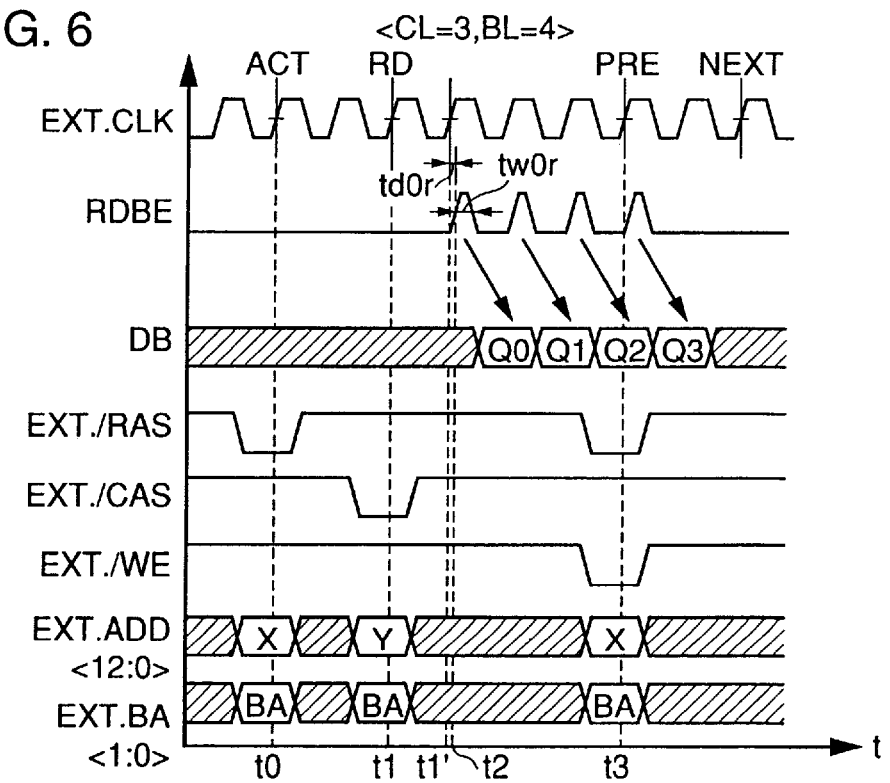
FIG. 6 is a timing chart referenced for describing a data output from a memory cell array 30 in response to a data output pulse RDBE.

In FIG. 6, a data output from memory array 30 during the normal operation in response to data output pulse RDBE is shown.

With reference to FIG. 6, an activate command ACT is indicated according to a combination of the external command control signals (EXT./RAS=L level, EXT./CAS= EXT.IWE=H level) at the time t0, and a bank address BA selected according to external bank address bits EXT.BA<1:0> and a row address X selected according to external address bits EXT.ADD<12:0> are taken in.

In response thereto, a row-related operation is activated by control circuit 40 for a group of memory cells in memory cell array 30 corresponding to bank address BA and row address X.

At time t1, that is, two clock cycles after the generation of activate command ACT, according to a combination of the external command control signals (EXT./CAS=L level, EXT./RAS=EXT./WE=H level), a read command RD is generated and a reading operation from a column address Y indicated by external address bits EXT.ADD<12:0> is indicated.

Data input/output pulse generation circuit 145 activates a data output pulse RDBE for a predetermined time period tw0r at time t2, that is, a predetermined time period td0r after time t1' which is one clock cycle after the indication of read command RD. Corresponding to burst length BL=4, activation/inactivation of data output pulse RDBE repeats at the same cycle with external clock signal EXT.CLK for four clock cycles.

Read/write circuit 35 supplies data Q0~Q3 corresponding to the burst length sequentially from memory cell array 30 to data bus DB during each activation period of data output pulse RDBE.

At time t3 when the clock cycles corresponding to the burst length has elapsed, a precharge command PRE is activated for the same bank address BA according to a combination of the external command control signals (EXT./CAS=H level, EXT./RAS=EXT./WE=L level) and a preparation for the next command input is performed.

Next, data transmission between memory cell array 30 and BIST circuit 100 will be described.

Again with reference to FIG. 1, semiconductor memory device 1000 further includes a data bus interface circuit 120. Data bus interface circuit 120 includes a data bus drive circuit 122 for supplying a 16-bit data signal A2DIN<15:0> output from BIST circuit 100 to data bus DB and an amplifier circuit 124 for delivering data on data bus DB to determination circuit 110. Data signal A2DIN<15:0> is a test data signal output from test data generation circuit 115 or determination result data output from determination circuit 110.

Control circuit 40 further includes a BIST data bus enable signal generation circuit 150. BIST data bus enable signal generation circuit 150 activates BIST data bus enable signal BISTDBE according to a timing when a data transmission between BIST circuit 100 and data bus DB is required in the BIST mode in which self test enable signal TMBE is activated.

Figure 7:
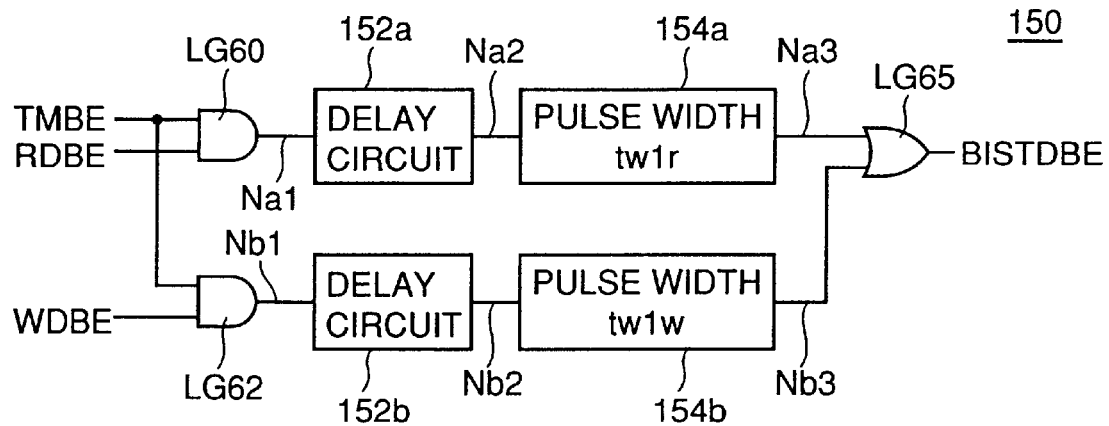
FIG. 7 is a block diagram showing a structure of a data bus enable signal generation circuit 150.

With reference to FIG. 7, BIST data bus enable signal generation circuit 150 includes a logical gate LG60 supplying a result of an AND logical operation between data output pulse RDBE and self test enable signal TMBE to a node Na1, a delay circuit 152a delaying an output signal to a node Na1 by a predetermined time period and supplying the resulting signal to a node Na2, and a pulse width setting circuit 154a supplying to a node Na3 a pulse signal having a predetermined pulse width corresponding to a predetermined change of the signal level of node Na2.

BIST data bus enable signal generation circuit 150 further includes a logical gate LG62 supplying a result of an AND logical operation between data input pulse WDBE and self test enable signal TMBE to a node Nb1, a delay circuit 152b delaying an output signal to node Nb1 by a predetermined time period and supplying the resulting signal to node Nb2, a pulse width setting circuit 154b supplying to node Nb3 a pulse signal having a predetermined pulse width corresponding to a predetermined change in the signal level of node Nb2, and a logical gate LG65 supplying a result of an OR logical operation between the signals on node Na3 and node Nb3 as BIST data bus enable signal BISTDBE.

Figure 8:
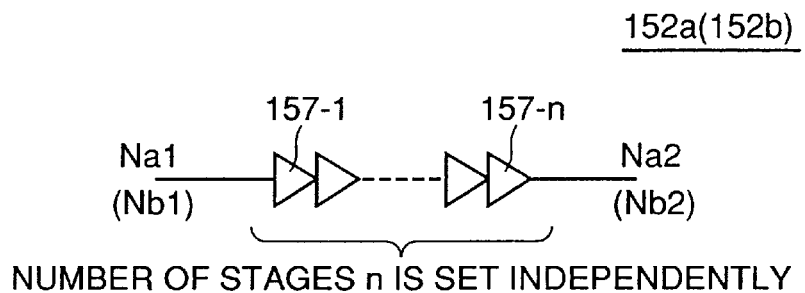
FIG. 8 is a circuit diagram showing a structure of a delay circuit.

With reference to FIG. 8, delay circuit 152a includes n (n is a natural number) buffer elements 157-1~157-n connected between node Na1 and node Na2. The delay time can be adjusted by the number of buffer elements n and, whereby the difference in activation timing of data output pulse RDBE and BIST data bus enable signal BISTDBE can be adjusted.

Delay circuit 152b has the same structure as delay circuit 152a and includes a plurality of buffer elements connected between node Nb1 and node Nb2. The number of buffer elements determining the delay time can be independently set for delay circuit 152a corresponding to data output pulse RDBE and for delay circuit 152b corresponding to data input pulse WDBE.

Figure 9:
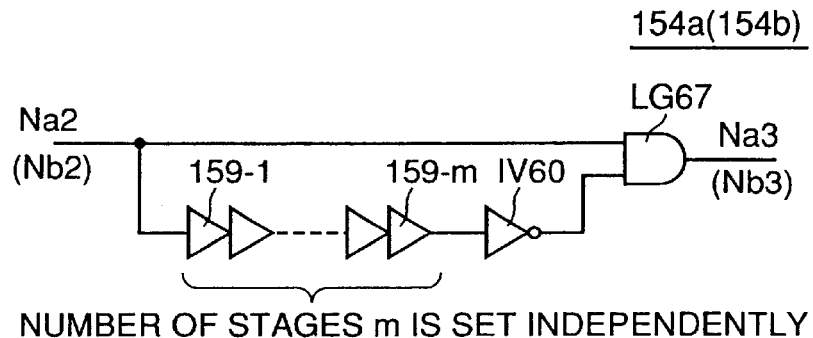
FIG. 9 is a circuit diagram showing a structure of a pulse width setting circuit.

With reference to FIG. 9, pulse width setting circuit 154a includes buffer elements 159-1~159-m (m is a natural number) for delaying an output signal to node Na2 by a predetermined time period, an inverter IV60 inverting an output from buffer elements, and a logical gate LG67 supplying a result of an AND logical operation between an output of inverter IV60 and the signal on node Na2 to node Na3.

With this structure, a one shot pulse having a pulse width corresponding to the delay time period provided by buffer elements 159-1~159-m is generated at node Na3 in response to the rise of the signal level of node Na2 from an L level to an H level.

Pulse width setting circuit 154b has the same structure as pulse width setting circuit 154a and generates a one shot pulse having a pulse width corresponding to the delay time period provided by the buffer elements to node Nb3 in response to the rise of the signal level of node Nb2 from an L level to an H level.

The number of buffer elements determining the delay time period can be set independently for pulse width setting circuit 154a corresponding to data output pulse RDBE and for pulse width setting circuit 154b corresponding to data input pulse WDBE.

Thus, in the BIST mode in which self test enable signal TMBE is activated (to an H level), BIST data bus enable signal generation circuit 150 generates BIST data bus enable signal BISTDBE based on data input pulse WDBE and data output pulse RDBE through the independent adjustment of each of activation timing and activation time period. In the normal operation mode in which self test enable signal TMBE is inactivated (to an L level), BIST data bus enable signal generation circuit 150 maintains the inactive state (L level) of BIST data bus enable signal BISTDBE, whereby data input/output between BIST circuit 100 and data bus DB is not performed.

Figure 10:
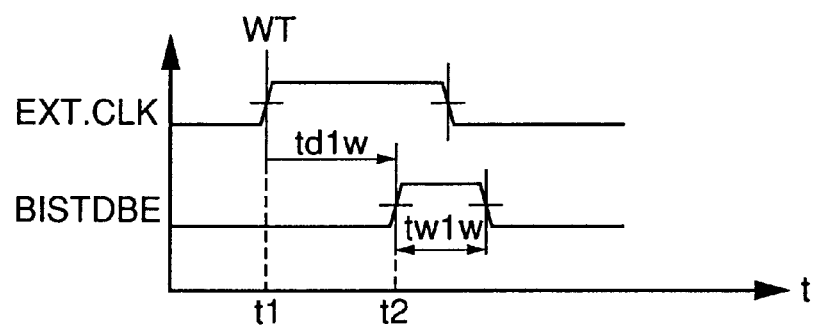
FIG. 10 is a chart referenced for describing an activation timing of a data bus enable signal when a data signal is supplied from a BIST circuit to a data bus.
Figure 11:
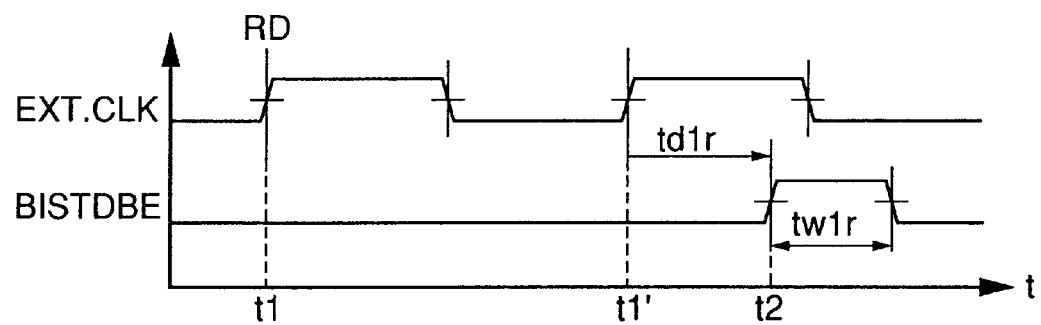
FIG. 11 is a chart referenced for describing an activation timing of a data bus enable signal when data is supplied from a data bus to a BIST circuit.

In FIGS. 10 and 11, an activation timing of the BIST data bus enable signal when the data signal is output from the BIST circuit to the data bus and when data is input from the data bus to the BIST circuit are shown, respectively.

With reference to FIG. 10, BIST data bus enable signal BISTDBE generated based on data input pulse WDBE by BIST data bus enable signal generation circuit 150 is activated at the time t2, that is, td1w after time t1 of the indication of the write command WT generation, and maintained at an active state for a period tw1w. Here, td1w corresponds to the sum of timing difference td0w (FIG. 5) of data input pulse WDBE and a delay time of buffer elements in delay circuit 152b. In addition, tw1w corresponds to a delay time provided by buffer elements in pulse width setting circuit 154b.

With reference to FIG. 11, BIST data bus enable signal BISTDBE generated based on data output pulse RDBE by BIST data bus enable signal generation circuit 150 is activated at time t2, that is, td1r after the time t1', which is one clock cycle after time t1 of the indication of the read command RD generation and maintained at an active state for a time period tw1r. Here, td1r corresponds to the sum of timing difference td0r (FIG. 6) of data output pulse RDBE and a delay time generated by buffer elements in delay circuit 152a. In addition, tw1r corresponds to a delay time provided by buffer elements in pulse width setting circuit 154a.

Thus, time periods td1w and td1r, that is, period from a timing of the indication of write command and read command generation to the activation of BIST data bus enable signal BISTDBE can be set independently from each other, and an activation time period tw1w and tw1r of BIST data bus enable signal BISTDBE can be independently set from each other as well.

As described above, at the time of data input from the BIST circuit to the data bus and at the time of data output from the BIST circuit to the data bus, BIST data bus enable signal BISTDBE can be independently adjusted.

As a result, timing adjustment of the read/write test in the self test mode can be more easily performed whereby the performance of the self test can be improved.

Again with reference to FIG. 1, amplifier circuit 124 operates in response to BIST data bus enable signal BISTDBE and transmits data on data bus DB to determination circuit 110 as data E2DQ<15:0> for determination.

Data bus drive circuit 122 outputs data signal A2DIN<15:0> supplied from the BIST circuit to the data bus DB in response to BIST data bus enable signal BISTDBE and a driver enable signal A2DRV activated by BIST circuit 100 at the time of test data output.

Figure 12:
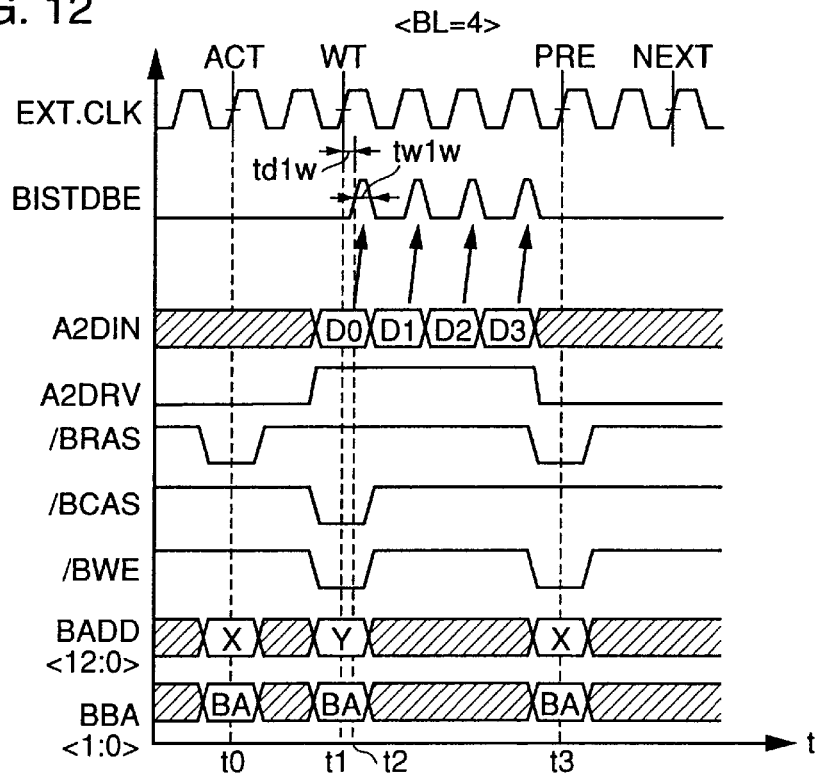
FIG. 12 is a timing chart referenced for describing a data output from a self test circuit in response to a data bus enable signal in a self test mode.

In FIG. 12, a data output from the BIST circuit in the self test mode is shown.

Comparing FIG. 12 with FIG. 5, in the self test mode, a command is generated according to a combination of test command control signals/BRAS, /BCAS and /BWE each corresponding to external command control signals EXT./RAS, EXT./CAS and EXT.IWE in the normal operation mode. In addition, an address selection in memory cell array 30 is performed according to test address bits BADD<12:0> and test bank address bits BBA<1:0>.

In response to the generation of write command WT indicated at the time t1, data input pulse WDBE is activated (not shown) at the timing shown in FIG. 5. Further, BIST data bus enable signal BISTDBE is activated by data bus enable signal generation circuit 150. Data bus drive circuit 122 which is turned into an operational state by driver enable signal A2DRV outputs to data bus DB data signal A2DIN from the BIST circuit in response to BIST data bus enable signal BISTDBE. Read/write circuit 35 supplies data signal A2DIN on data bus DB to a memory cell of an address selected by test address bits BADD<12:0> and test bank address bits BBA<1:0> in response to data input pulse WDBE.

After the clock cycle corresponding to the burst length is elapsed and the writing of a predetermined data supplied from BIST circuit 100 to memory cell array 30 is completed at time t3, precharge command PRE for the same bank address BA is activated corresponding to a combination of test command control signals (/BCAS=H level,/BRAS=/BWE=L level) and a preparation for the next command input is performed.

Figure 13:
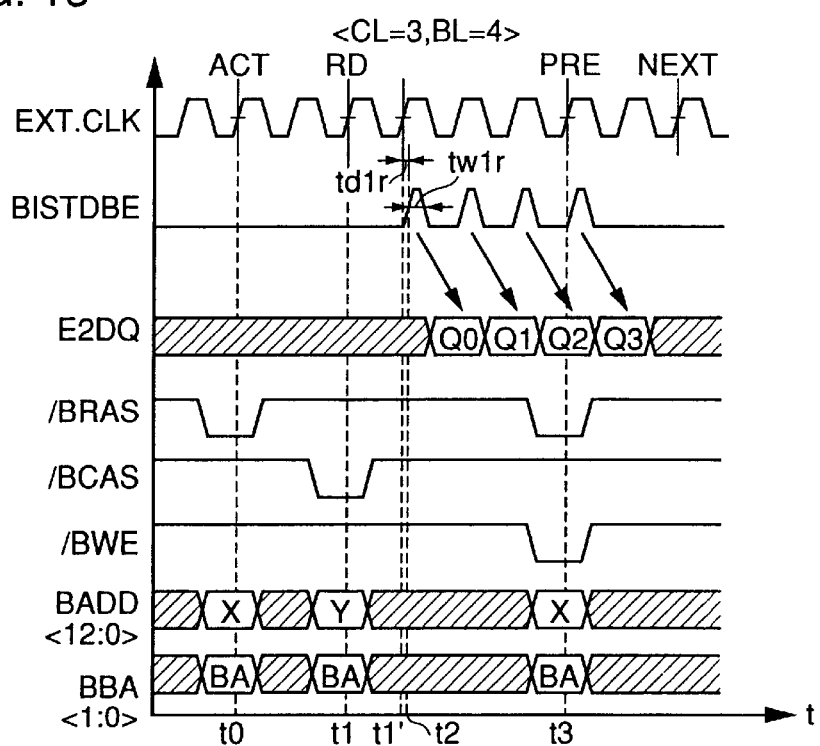
FIG. 13 is a timing chart referenced for describing a data input to a self test circuit in response to a data bus enable signal in a self test mode.

In FIG. 13, a data input to the BIST circuit in the self test mode is shown.

Comparing FIG. 13 with FIG. 6, in the self test mode, a command is generated according to a combination of test command control signals/BRAS, /BCAS and /BWE each corresponding to external command control signals EXT./RAS, EXT./CAS and EXT./WE in the normal operation mode. In addition, an address selection in memory cell array 30 is performed according to test address bits BADD<12:0> and test bank address bits BBA<1:0>.

In response to the generation of read command RD indicated at the time t1, data output pulse RDBE (not shown) is activated at the timing shown in FIG. 6. In addition, BIST data bus enable signal BISTDBE is activated by data bus enable signal generation circuit 150. Read/write circuit 35 transmits read data from a memory cell of an address selected by test address bits BADD<12:0> and test bank address bits BBA<1:0> to data test address bits SADD>12:0>and test bank address bits BBA>1:0>to data bus DB in response to data output pulse RDBE.

Amplifier circuit 124 operates in response to BIST data bus enable signal BISTDBE and transmits data supplied to data bus DB to determination circuit 110 as data E2DQ for determination.

After the elapse of the clock cycle corresponding to the burst length, at time t3, a precharge command PRE is activated for the same bank address BA according to a combination of the test command control signals (/BCAS=H level, /BRAS=/BWE=L level) and a preparation for the next command input is performed.

Thus data input/output between BIST circuit 100 and memory cell array 30 can be performed using data bus DB employed in the normal operation mode.

Next, an interface at the determination result output from determination circuit 110 will be described.

BIST circuit 100 further outputs BIST read control signals BISTRE1 and BISTRE2 to control circuit 40.

BIST read control signal BISTREL is activated by BIST circuit 100 when the determination result data is output from determination circuit 110 to data bus DB. In the BIST mode, data input/output circuit 45 operates in response to the activation of BIST read control signal BISTRE1 and externally outputs a data signal on data bus DB via data input/output terminal 20. In the BIST mode, in which the BIST data bus enable signal is activated, data input/output circuit 45 does not accept data input from an external source via data input/output terminal 20 in the same manner as input switching circuits 50, 52 and 54.

The output of the determination result data from determination circuit 110 is performed by the generation of read command by the BIST circuit. In response to the generation of the read command, BIST data bus enable signal BIST-DBE is generated, thus the output of the determination result data to data bus DB by data bus drive circuit 122 is allowed.

BIST read control signal BISTRE2 is generated to suspend the data output from memory cell array 30 to data bus DB at this time.

Figure 14:
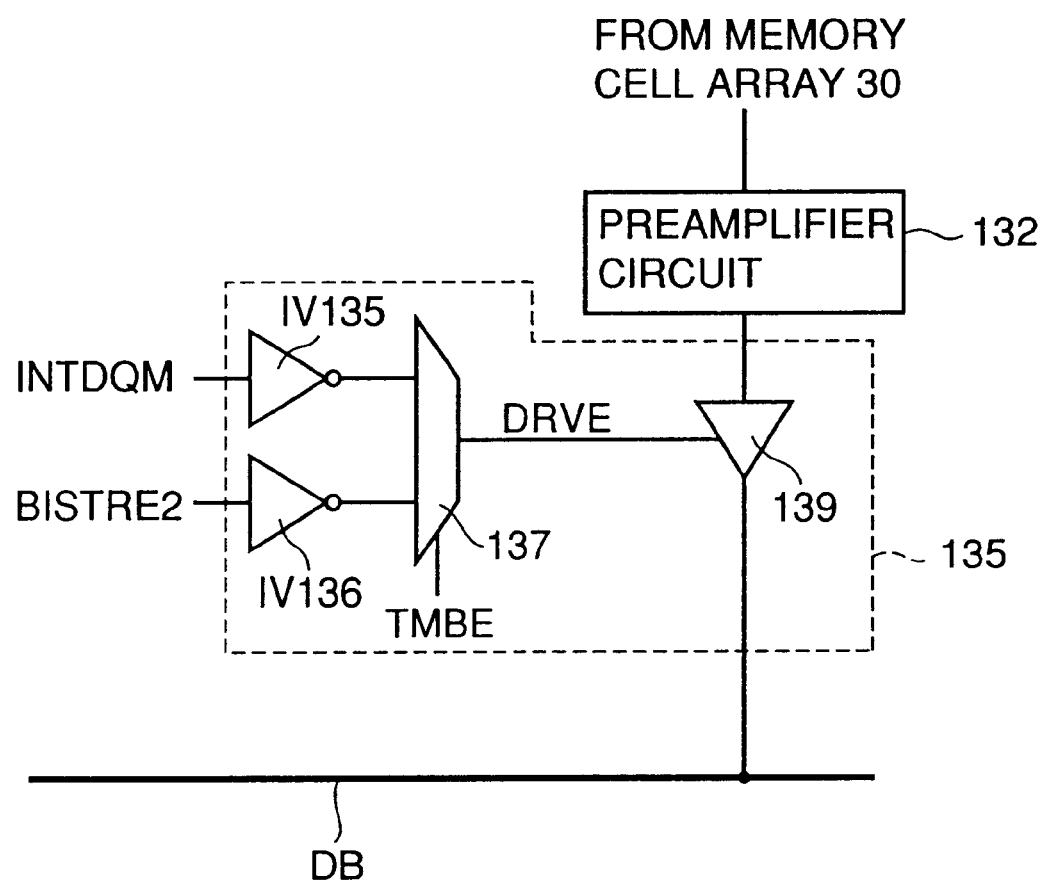
FIG. 14 is a circuit diagram showing a structure of a read data masking circuit 135.

With reference to FIG. 14, read data masking circuit 135 is included in read/write circuit 35 and is a circuit to suspend the data output from memory array 30 in response to the generation of the data mask command at the time of reading operation in the normal operation mode.

Data mask command is executed in response to the activation of data mask control signal INTDQM generated by input buffer 27 in response to data mask external control signal EXT.DQM input to data mask terminal 22 shown in FIG. 1. Input buffer 27 is activated in response to internal clock enable signal INTCKE and generates data mask control signal INTDQM.

Read data masking circuit 135 is arranged between a preamplifier circuit 132 amplifying the read data from memory cell array 30 and data bus DB.

Read data masking circuit 135 includes an inverter IV135 inverting data mask control signal INTDQM which is activated (to an H level) at the time of generation of data mask command in the normal operation mode, an inverter IV136 inverting BIST read control signal BISTRE2 which is activated (to an H level) at the time of determination result data output in the BIST mode, and a multiplexer 137 supplying one of outputs of inverter IV135 and inverter IV136 as a data mask drive signal DRVE according to the signal level of self test enable signal TMBE.

Multiplexer 137 selects an output from inverter IV136 and sets data mask drive signal DRVE according to BIST read control signal BISTRE2 in the BIST mode where self test enable signal TMBE is in an active state (H level).

On the other hand, in the normal operation mode where self test enable signal TMBE is in an inactive state (L level), multiplexer 137 selects an output from inverter IV135 and sets data mask drive signal DRVE according to data mask control signal INTDQM.

Read data masking circuit 135 further includes a buffer circuit 139 for transmitting an output from preamplifier circuit 132 to data bus DB. Buffer circuit 139 functions as a buffer and performs a signal transmission when data mask drive signal DRVE is inactivated (to an H level), whereas cuts the line between preamplifier circuit 132 and data bus DB and does not perform the signal transmission if data mask drive signal DRVE is activated (to an L level).

With such structure, read data masking circuit 135 suspends the data output from memory cell array 30 to data bus DB in response to the activation of data mask control signal INTDQM in the normal operation mode. On the other hand, in the BIST mode, read data masking circuit 135 suspends the data output from memory cell array 30 to data bus DB in response to the activation of BIST read control signal BISTRE2.

Thus, in semiconductor memory device 1000 according to the embodiment of the present invention, the external output of the determination result by the BIST circuit can be performed using data bus DB, read data masking circuit 135 and data input/output circuit 45 employed in the normal operation mode without the need of a special interface.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device operating in response to a plurality of command control signals and an address signal including a plurality of address bits, comprising:
   a memory cell array including a plurality of memory cells arranged as a matrix;
   a plurality of external command terminals externally receiving said plurality of command control signals;
   a plurality of external address terminals externally receiving said plurality of address bits;
   a self test circuit operating at a time of test execution and supplying said plurality of command control signals and said plurality of address bits based on a predetermined test pattern;
   a first input switching circuit for supplying a plurality of internal command control signals according to (1) said plurality of command control signals received from said plurality of external command terminals, or (2) the plurality of command control signals received from said self test circuit;
   a second input switching circuit for supplying an internal address signal having a plurality of internal address bits according to (1) said plurality of address bits received from said plurality of external address terminals, or (2) the plurality of address bits received from said self test circuit;
   a test mode circuit determining an operation state of said self test circuit according to said plurality of internal command control signals and said internal address signal; and
   a control circuit controlling outputs of said first and second input switching circuits according to said operation state of said self test circuit,
   said control circuit controlling an operation for said memory cell array according to said plurality of internal command control signals and said internal address signal.

2. The semiconductor memory device according to claim 1, wherein
   said control circuit generates a mode setting signal according to a combination of said plurality of internal command control signals,
   said test mode circuit outputs a self test execution signal according to said internal address signal and said mode setting signal, to operate said self test circuit, and
   said control circuit generates an input switching control signal for controlling outputs of said first and second input switching circuits according to said self test execution signal.

3. The semiconductor memory device according to claim 2, wherein
   said first input switching circuit includes a plurality of signal switching units provided corresponding to said plurality of internal command control signals, respectively,
   each of said signal switching units includes
      a signal transmission circuit activated according to said input switching control signal, determining a signal level of an internal node according to the command control signal received from a corresponding one of said plurality of external command terminals,
      a signal level fixing circuit activated complementary with said signal transmission circuit, fixing the signal level of said internal node, and a logical circuit setting a signal level of the corresponding internal command control signal according to the signal level of said internal node and a signal level of a corresponding one of the plurality of command control signals output from said self test circuit.

4. The semiconductor memory device according to claim 3, wherein
said input switching control signal is activated in response to an activation of said self test execution signal;
said signal transmission circuit includes
a first transistor turned on according to an inactivation of said input switching control signal,
a first inverter supplied with a driving current via said first transistor, inverting the command control signal received from the corresponding one of said plurality of external command terminals and supplying a resulting signal, and
a second inverter connected between said first inverter and said internal node; and
said signal level fixing circuit includes a second transistor electrically coupled between a voltage node supplying a voltage of a level corresponding to a predetermined one of the signal levels of the corresponding command control signal and an input node of said second inverter, and turned on according to an activation of said input switching control signal.

5. The semiconductor memory device according to claim 2, wherein
said second input switching circuit includes a plurality of signal switching units provided corresponding to said internal address bits, respectively,
each of said signal switching units includes
a signal transmission circuit activated according to said input switching control signal, determining a signal level of an internal node according to the address bit received from a corresponding one of said plurality of external address terminals,
a signal level fixing circuit activated complementary with said signal transmission circuit, fixing the signal level of said internal node, and
a logical circuit setting a signal level of the corresponding internal address bit according to the signal level of said internal node and a signal level of a corresponding one of said plurality of address bits output from said self test circuit.

6. The semiconductor memory device according to claim 5, wherein
said input switching control signal is activated in response to an activation of said self test execution signal;
said signal transmission circuit includes
a first transistor turned on according to an inactivation of said input switching control signal,
a first inverter supplied with a driving current via said first transistor, inverting the address bit received from the corresponding one of said plurality of external address terminals and supplying a resulting signal, and
a second inverter connected between said first inverter and said internal node, and
said signal level fixing circuit includes a second transistor electrically coupled between a voltage node supplying a voltage of a level corresponding to a predetermined one of the signal levels of the corresponding address bit and an input node of said second inverter, and turned on according to an activation of said input switching control signal.

7. The semiconductor memory device according to claim 2, further comprising
a self test control circuit provided between a part of said plurality of external address terminals and said self test circuit, wherein
said self test control circuit supplies as self test control bits to said self test circuit the address bits supplied respectively to said part of said external address terminals when said self test execution signal is activated, and
said self test circuit supplies a combination of said internal address bits for indicating an inactivation of said self test execution signal according to said self test control bits.

8. The semiconductor memory device according to claim 1, further comprising
a command control signal generation circuit provided between said self test circuit and said first input switching circuit and generating one of said plurality of command control signals according to the others of said plurality of command control signals.

9. The semiconductor memory device according to claim 8, wherein
said command control signal generation circuit supplies a chip select signal as said one of the plurality of command control signals, and
said command control signal generation circuit activates the chip select signal when one of a row address strobe signal and a column address strobe signal supplied from said self test circuit is activated.

10. The semiconductor memory device according to claim 1, wherein
said self test circuit includes
a test data output circuit supplying a test data signal for performing a writing to said memory cell array based on a predetermined test pattern at a time of said test execution, and
a determination circuit performing a determination based on read data from said memory cell array and supplying determination result data at the time of said test execution,
said semiconductor memory device further comprises
a data bus for transmitting input/output data to/from said memory cell array,
a data read/write circuit controlled by said control circuit for performing a data input/output operation between said memory cell array and said data bus, and
a test interface circuit for performing a data input/output operation between said self test circuit and said data bus, wherein
said test interface circuit includes
a data amplifier circuit transmitting data on said data bus to said determination circuit as said read data at a timing controlled by said control circuit, and
a data bus drive circuit transmitting output data from said self test circuit to said data bus at a timing controlled by said control circuit.

11. The semiconductor memory device according to claim 10, wherein
said control circuit includes
a first signal generation circuit generating a regular data output pulse for indicating a timing of outputting data from said memory cell array and a regular data input pulse indicating a timing of inputting data to said memory cell array, and a second signal generation circuit generating a test data input/output signal based on said regular data output pulse and said regular data input pulse when said self test circuit is operating, wherein said second signal generation circuit independently sets an activation timing and an activation period of said test data input/output signal at the time of generation of said test data input/output signal based on said regular data output pulse and at the time of generation of said test data input/output signal based on said regular data input pulse, and said data amplifier circuit and said data bus drive circuit operate in response to said test data input/output signal.

12. The semiconductor memory device according to claim 11, wherein said second signal generation circuit includes a first logical circuit receiving a self test execution signal which is activated at the time of said test execution and said regular data output pulse and supplying said regular data output pulse when said self test execution signal is activated, a first delay circuit delaying an output of said first logical circuit by a first delay time period, a first pulse generation circuit generating a pulse signal to be activated for a first predetermined time period according to a predetermined one of changes in an output level of said first delay circuit, a second logical circuit receiving said self test execution signal and said regular data input pulse and supplying said regular data input pulse when said self test execution signal is activated, a second delay circuit delaying an output of said second logical circuit by a second delay time period, a second pulse generation circuit generating a pulse signal to be activated for a second predetermined time period according to a predetermined one of changes in an output level of said second delay circuit, and a third logical circuit supplying a result of a combination operation between outputs of said first and second pulse generation circuits as said test data input/output signal.

13. The semiconductor memory device according to claim 10, further comprising an external data terminal receiving/transmitting data from/to an external source, and a data input/output circuit performing a data input/output operation between said data bus and said external data terminal, wherein said data read/write circuit includes a read data masking circuit for suspending outputting data from said data read/write circuit to said data bus, when said determination result data from said determination circuit is supplied to said data bus at the time of said test execution, and a data mask control signal is activated at the time of normal operation.

14. The semiconductor memory device according to claim 13, wherein said data input/output circuit suspends data input from said external data terminal to said data bus at the time of said test execution.

15. The semiconductor memory device according to claim 1, wherein a transition to said time of test execution is indicated by a predetermined input to at least one of said plurality of external command terminals and plurality of external address terminals.

16. The semiconductor memory device according to claim 15, wherein said predetermined input is an application of high potential.

* * * * *